United States Patent
Bellin et al.

(10) Patent No.: US 8,035,969 B2
(45) Date of Patent: Oct. 11, 2011

(54) AERAULIC COOLING DEVICE FOR A "FULL ARINC" COMPUTER

(75) Inventors: Bruno Bellin, Ville Verrieres-le-Buisson (FR); Patrick Manesse, Orry la Ville (FR)

(73) Assignee: Thales, Neuilly sur Seine (FR)

( * ) Notice: Subject to any disclaimer, the term of this patent is extended or adjusted under 35 U.S.C. 154(b) by 248 days.

(21) Appl. No.: 12/535,602

(22) Filed: Aug. 4, 2009

(65) Prior Publication Data

US 2010/0033920 A1  Feb. 11, 2010

(30) Foreign Application Priority Data

Aug. 5, 2008  (FR) .................................... 08 04476

(51) Int. Cl.
*H05K 7/20* (2006.01)
(52) U.S. Cl. ......... 361/695; 361/690; 361/694; 454/184
(58) Field of Classification Search .................. 361/690, 361/694–695; 454/184

See application file for complete search history.

(56) References Cited

U.S. PATENT DOCUMENTS

| | | | | |
|---|---|---|---|---|
| 4,458,296 A | * | 7/1984 | Bryant et al. | 361/691 |
| 5,170,320 A | | 12/1992 | Pease | |
| 5,190,241 A | * | 3/1993 | Pease | 244/1 R |
| 5,940,266 A | * | 8/1999 | Hamilton et al. | 361/695 |
| 5,995,368 A | * | 11/1999 | Lee et al. | 361/695 |
| 6,797,879 B2 | * | 9/2004 | Leyda et al. | 174/50 |
| 7,869,209 B2 | | 1/2011 | Nemoz et al. | |
| 2009/1016172 | | 6/2009 | Gatti et al. | |
| 2009/0318071 A1 | | 12/2009 | Nemoz et al. | |

FOREIGN PATENT DOCUMENTS

| | | |
|---|---|---|
| EP | 0 886 463 A | 12/1998 |
| FR | 2 524 757 A | 10/1983 |
| FR | 2 886 509 A | 12/2006 |
| JP | 11 274776 A | 10/1999 |

* cited by examiner

*Primary Examiner* — Gregory Thompson
(74) *Attorney, Agent, or Firm* — LaRiviere, Grubman & Payne, LLP

(57) ABSTRACT

The invention proposes a new aeraulic cooling design for ARINC series 600 computers. Using a network of ducts (N) and holes (HM) on an intermediate plate (M) situated just above the bottom place (B) through which a stream of cool air (AF) is injected into said computer (C), the present invention makes it possible to effectively cool the dissipative areas and the identified hot spots on the electronic modules (E) that it contains.

9 Claims, 4 Drawing Sheets

AERAULIC COOLING DEVICE FOR A "FULL ARINC" COMPUTER

PRIORITY CLAIM

Figure 1:
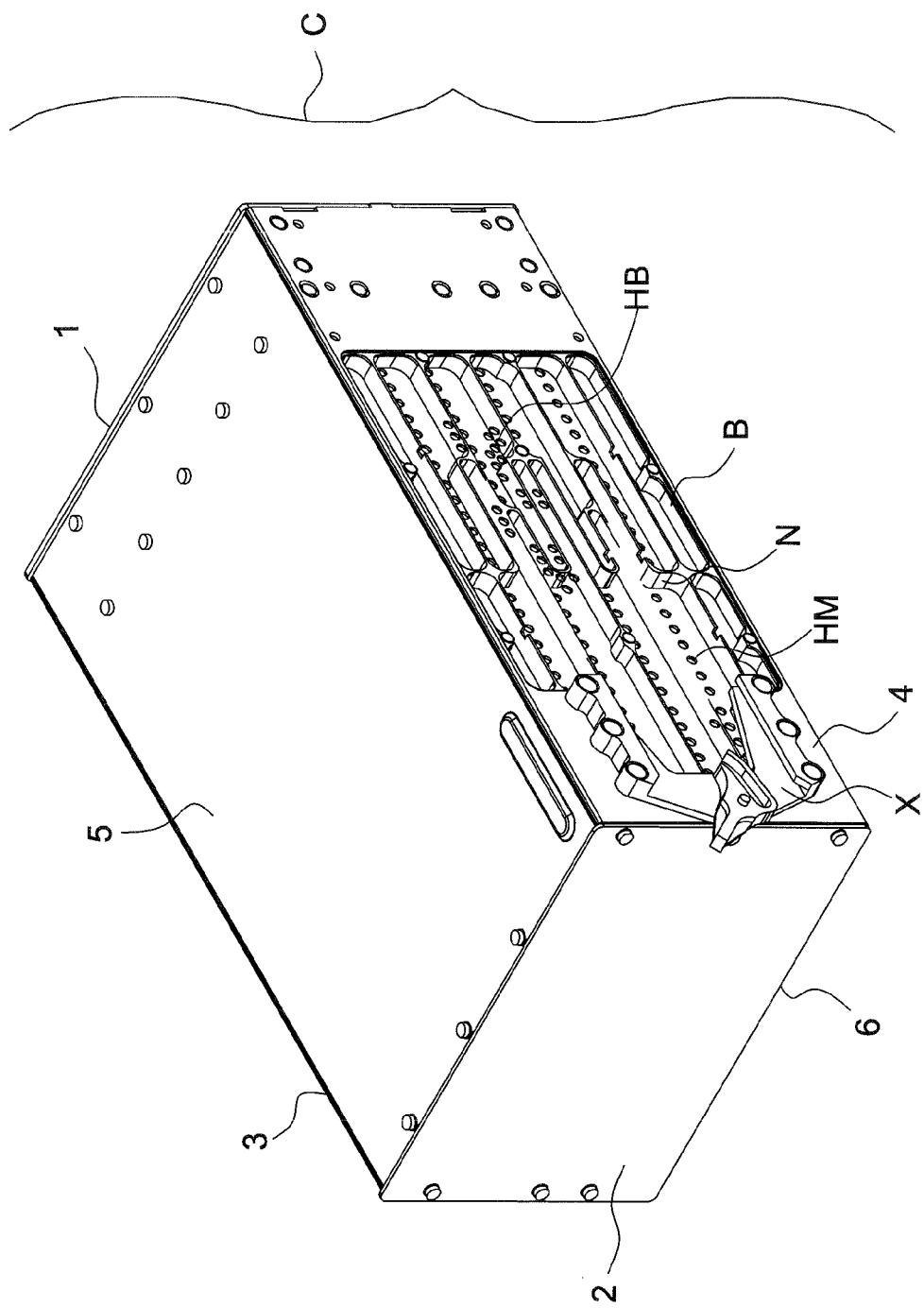

This application claims priority to French Patent Application Number 08 04476, Aeraulic Cooling Device for a "Full ARINC" Computer, filed on Aug. 5, 2008.

FIELD OF THE INVENTION

The present invention relates to the field of onboard computers, and in particular computers compliant with the ARINC 600 standard and intended for aeronautics. More specifically, the invention proposes a novel aeraulic cooling concept for ARINC 600 computers.

BACKGROUND OF THE INVENTION

The ARINC 600 standard provides for avionics computers to be cooled using a current of cool air circulating under the computers. Each computer is allocated a portion of the total flow of this current of cool air, notably according to the power that it dissipates, in order to cool it. This cool air is injected into the computers via a bottom plate, commonly called "bottom cover". This bottom plate is drilled with calibrated holes, each computer having to comply with constraints of head loss introduced on the current of cool air. The calibration of the holes and the range of head loss to be introduced are specified in the ARINC standard. Typically, for a level 2 ARINC computer, the head loss to be introduced must be between 200 pascals and 300 pascals.

Until today, almost no effort has been made to optimize the use of the stream of cool air injected into the onboard computers, notably because the power density dissipated by the electronic modules was not too high and because the constraints relating to the head loss introduced were not very difficult to observe. Currently, the power dissipated by the electronic modules contained in the onboard computers is increasing and their cooling is therefore becoming a matter of prime importance. Furthermore, the head loss constraints are also becoming more difficult to support, the tolerance range falling from 100 pascals to 50 pascals.

It has therefore become essential to seek to improve the effectiveness of the aeraulic cooling of the onboard computers, notably by focusing on the hot spots identified on the electronic modules and by optimizing the management of the injected air stream.

In the state of the art, baffles have been added inside the computers for this purpose, in order to deflect the cool air as a priority to the hot spots of the electronic modules. However, this technique is inadequate and it also introduces new mechanical stress problems.

SUMMARY OF THE INVENTION

Thus, in order to obtain an optimized aeraulic cooling of an onboard computer, the invention proposes the addition of an intermediate plate situated above the bottom plate inside said computer, said intermediate plate including a network of ducts and holes making it possible to better manage the injected stream of cool air.

To this end, the subject of the invention is an onboard computer comprising electronic modules, a bottom plate, having first holes, through which a stream of cool air is injected into said computer, said computer having a front face, a rear face, a top face and a bottom face where said bottom plate is located, said electronic modules being inserted orthogonally to the rear face and also being approximately orthogonal to the bottom face, characterized in that it also comprises an intermediate plate situated above the bottom plate and including a network of ducts making it possible to effectively distribute the stream of cool air over the electronic modules, and second holes for routing said stream of cool air along said electronic modules.

Advantageously, the computer according to the invention conforms to the ARINC 600 standard.

Advantageously, the intermediate plate also has slide rails providing the "card guide" function for the electronic modules.

Advantageously, the second holes of the intermediate plate are distributed so that they make it possible to orient the stream of cool air to areas identified as particularly hot on the electronic modules.

Advantageously, the network of ducts contained in the intermediate plate is subdivided into as many parts as there are electronic modules, each part being assigned to cool an electronic module.

Advantageously, the intermediate plate is moreover subdivided into two areas, a front area and a rear area.

Advantageously, the bottom plate is removable.

Advantageously, said computer comprising a top plate that closes the computer at the level of the top face, the stream of cool air rises along the electronic modules until it reaches the top face where it is discharged through exhaust holes drilled in the top plate.

Advantageously, the inventive computer introduces, on a current of cool air circulating under the bottom plate of said computer, and of which a part, constituting said stream of cool air, is injected into the computer via said bottom plate, a head loss of between 250 pascals and 300 pascals.

BRIEF LIST OF THE DRAWINGS

Figure 2:
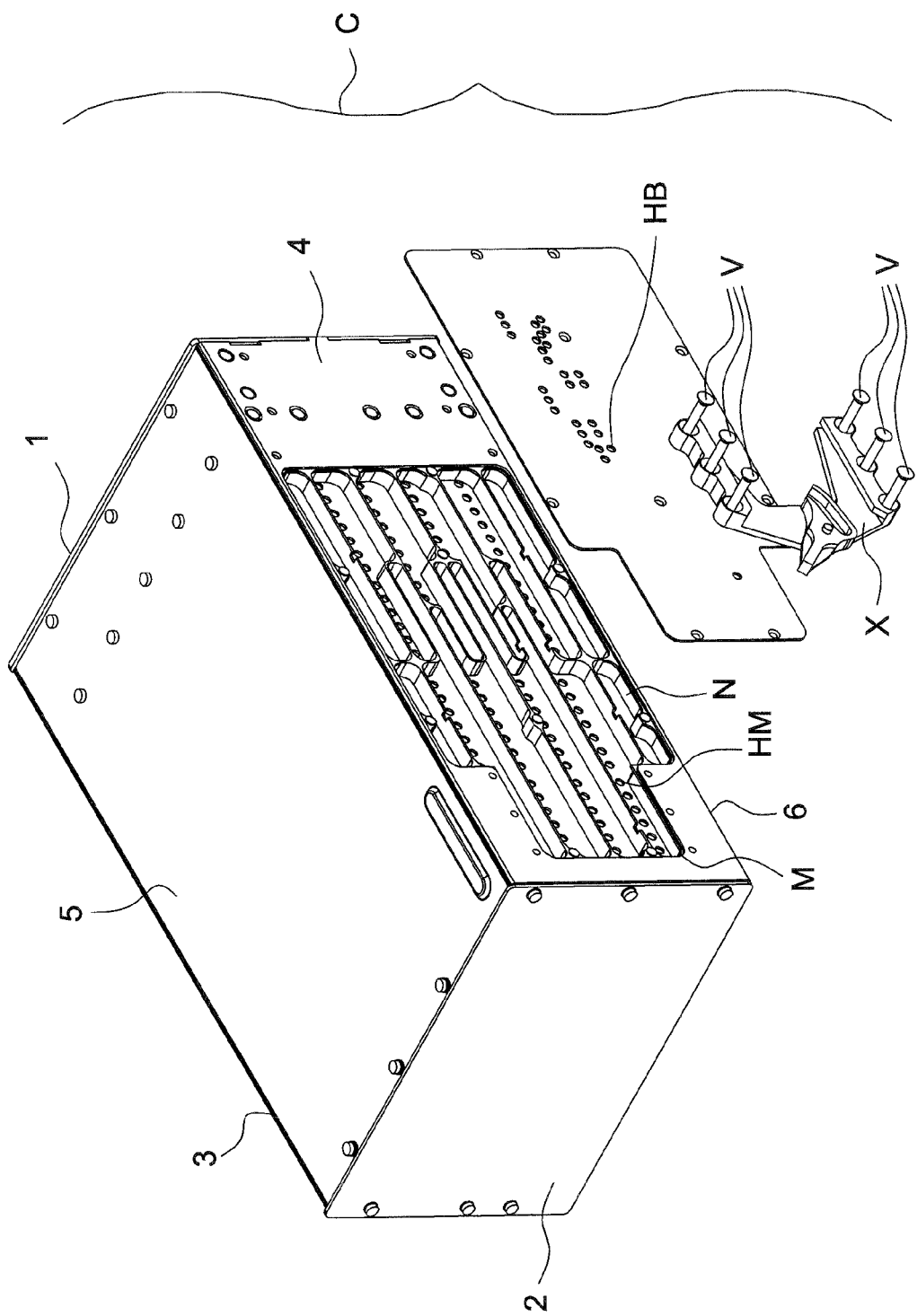
Figure 3:
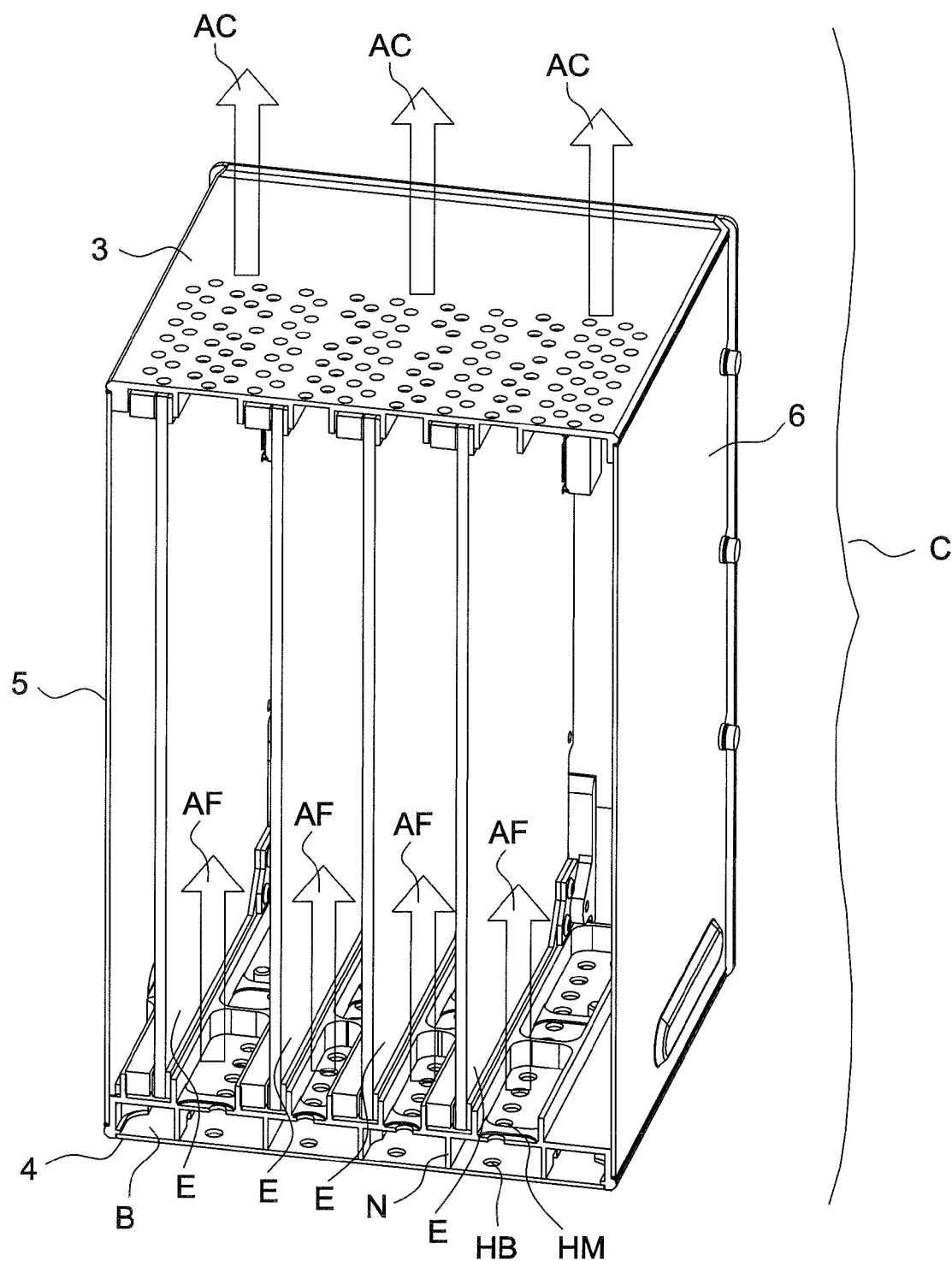
Figure 4:
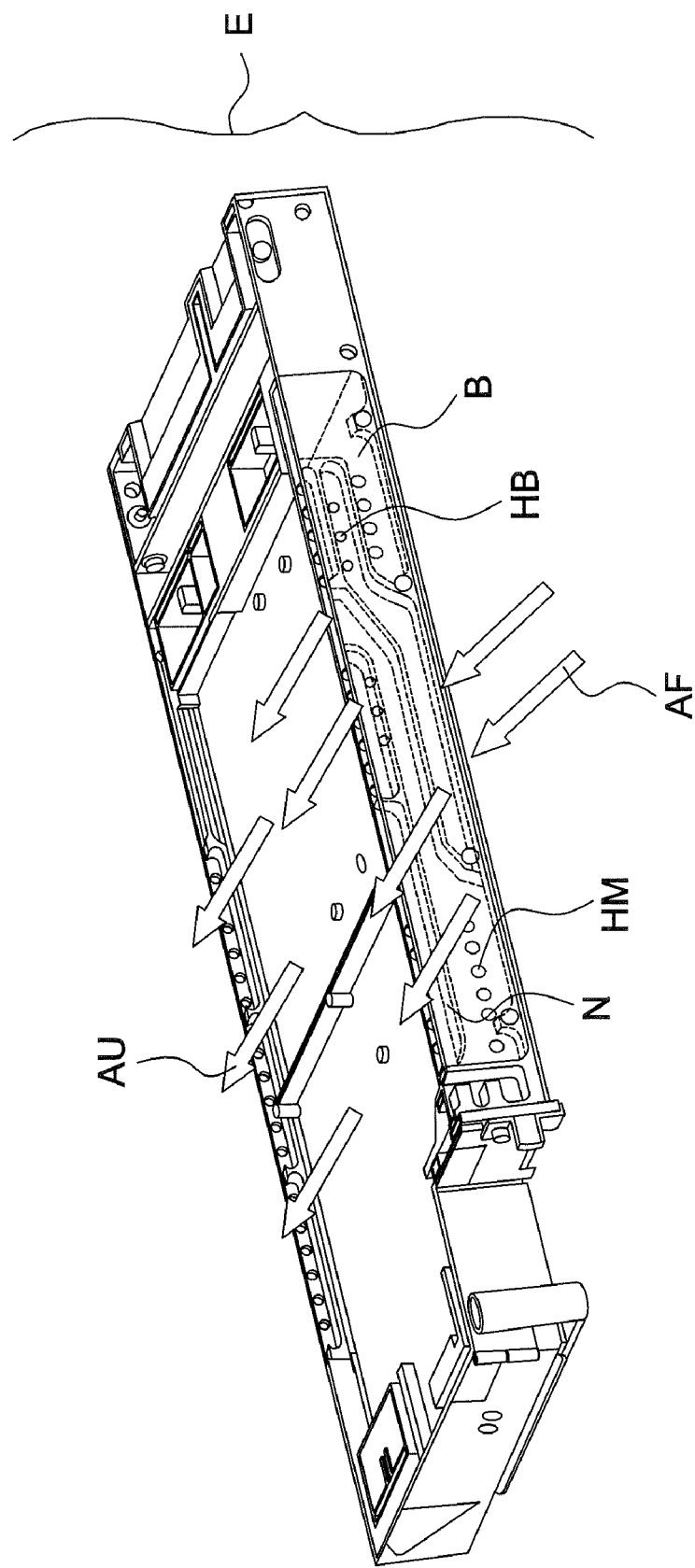

Other features and benefits of the invention will become apparent from the following description given in light of the appended drawings which represent:

FIG. 1: a three-dimensional view of a computer according to the invention, the bottom plate being made transparent, so as to show the intermediate plate;

FIG. 2: the partially exploded view of a computer according to the invention, highlighting the intermediate plate, the bottom plate and fixing means;

FIG. 3: the view of a computer according to the invention, open, so as to show the discharging of the air stream through the top face;

FIG. 4: the representation of the circulation of the stream of cool air at the level of an electronic module.

DETAILED DESCRIPTION OF THE INVENTION

FIG. 1 shows a three-dimensional view of a computer C according to the invention. The computer C has a front face 1, a rear face 2, a top face 3, a bottom face 4 and two lateral faces 5 and 6. At the level of the bottom face 4, the intermediate plate M can be distinguished through the bottom plate B drilled with holes HB. This intermediate plate M also has holes HM, and a network of ducts N. The bottom plate B and the intermediate plate M will be more specifically described using FIG. 2.

The computer C is cooled aeraulically using a current of cool air circulating under the bottom plate B, in accordance with the "ARINC stream" provided by the environment of the computer according to the ARINC standard. A portion of this air current is injected into the computer C via the bottom face 4.

FIG. 2 provides a better view of the bottom plate B and the intermediate plate M through a partially exploded view of the computer C. The bottom plate B is fixed to the computer C, and to the intermediate plate M in particular, by any fixing means, such as screws V and a lock X.

A portion of the air current circulating under the bottom plate B is therefore injected into the computer C through the holes HB drilled in said bottom plate B. These holes HB can be more numerous in the position of the hottest areas of the electronic modules contained in the computer C. Notably, if there are only two electronic modules in a computer that can contain four thereof, the holes HB will be drilled only under the electronic modules that are present. Furthermore, the bottom plate B is preferably removable. Thus, in the event of addition of a third electronic module into said computer, all that is needed is to modify the bottom plate B, in order for other holes HB to be able to provide the aeraulic cooling for the third electronic module.

Similarly, the judicious positioning of the holes HB makes it possible not to unnecessarily ventilate the areas that do not require cooling.

The stream of cool air having been injected into the computer C via the bottom plate B is distributed at the level of the intermediate plate M by a network of ducts N. This network of ducts N ensures the effective distribution of the cool air to the electronic modules, in particular to the areas exhibiting hot spots, that is to say, areas where the power dissipated by the electronic components present on the electronic modules is high, favouring local heating effects.

The intermediate plate M also has holes HM, more numerous in the position of the hot spots, making it possible to route the cool air along the electronic modules, as a priority toward the areas of the electronic modules that dissipate the most power.

Advantageously, the intermediate plate can be provided with slide rails, so providing the "card guide" function for the electronic modules of the computer C.

In order to optimize the distribution of the air stream at the level of the intermediate plate M, the network of ducts N can be subdivided into different parts. Firstly, the network of ducts N can include as many areas as there are electronic modules in the computer C. Each area is then responsible for distributing the air over an electronic module. Furthermore, each area can advantageously be subdivided into two parts, corresponding to a front part situated on the side of the front face 1 and a rear part situated on the side of the rear face 2. In this way, an optimized distribution of the stream of cool air over all the electronic modules of the computer C can be ensured, the holes HB providing additional flexibility. This also makes it possible to control the head loss introduced on the current of cool air circulating under the bottom face 4 and from which the stream of cool air AF injected into the computer C is taken. It is notably possible to accurately control the head loss introduced and contain it, for example, within the range from 250 pascals to 300 pascals.

FIG. 3 simply shows how the stream of cool air AF rises along the electronic modules E to the top face 3, where it becomes a stream of hotter air AC. The stream of cool air AF is taken from a current of air circulating under the bottom face 4. It is injected into the computer C via the holes HB in the bottom plate B. It is then distributed optimally using the network of ducts N which makes it possible to route the cool air preferentially to the dissipative areas and the hot spots of the electronic modules E. The cool air AF then rises naturally along the electronic modules E until it becomes a stream of hotter air AC at the level of the top face 3. This stream of hotter air AC can then be discharged through holes drilled in the plate that closes the computer C at the level of the top face 3. This stream of hotter air AC can then be recovered by the aeraulic network of the carrier of the computer for treatment.

FIG. 4 represents a three-dimensional view of an electronic module E extracted from the computer C. This FIG. 4 shows the fact that the cool air AF injected through the holes HB in the bottom plate B can be distributed over the electronic module E in a totally controlled manner thanks to the network of ducts N and the holes HM drilled in the intermediate plate M. It is thus possible to route more cool air AF to the areas most subject to overheating.

To sum up, the present invention proposes an onboard computer, cooled aeraulically using a current of air circulating under its bottom face, and equipped with a device making it possible to optimize the injection and the distribution of a stream of cool air inside said computer in order to cool it effectively and dealing as a priority with the hot spots of the electronic modules that it contains.

The invention claimed is:

1. Onboard computer comprising electronic modules (E), a bottom plate (B), having first holes (HB), through which a stream of cool air (AF) is injected into said computer (C), said computer (C) having a front face (1), a rear face (2), a top face (3) and a bottom face (4) where said bottom plate (B) is located, said electronic modules (E) being inserted orthogonally to the rear face (2) and also being approximately orthogonal to the bottom face (4), and also comprises an intermediate plate (M) situated above the bottom plate (B) and including a network of ducts (N) making it possible to effectively distribute the stream of cool air (AF) over the electronic modules (E), and second holes (HM) for routing said stream of cool air (AF) along said electronic modules (E).

2. Computer according to claim 1, which it conforms to the ARINC 600 standard.

3. Computer according to claim 1, wherein the intermediate plate (M) also has slide rails providing a "card guide" function for the electronic modules (E).

4. Computer according to claim 1, wherein the second holes (HM) of the intermediate plate (M) are distributed so that they make it possible to orient the stream of cool air (AF) to areas identified as particularly hot on the electronic modules (E).

5. Computer according to claim 1, wherein the network of ducts (N) contained in the intermediate plate (M) is subdivided into as many parts as there are electronic modules (E), each part being assigned to cool a respective electronic module (E)of the electronic module (E).

6. Computer according to claim 5, wherein each part of the network of ducts (N) contained in the intermediate plate (M) is also subdivided into two areas, a front area and a rear area.

7. Computer according to claim 1, wherein the bottom plate (B) is removable.

8. Computer according to claim 1, said computer comprising a top plate that closes the computer at the level of the top face, wherein the stream of cool air (AF) rises along the electronic modules (E) until it reaches the top face (3) where it is discharged through exhaust holes drilled in the top plate.

9. Computer according to claim 1, introducing on a current of cool air circulating under the bottom plate (B) of said computer (C), and of which a part, constituting said stream of cool air (AF), is injected into the computer (C) via said bottom plate (B), a head loss of between approximately 250 pascals and approximately 300 pascals.

* * * * *